US010388681B2

(12) United States Patent
Ohri

(10) Patent No.: US 10,388,681 B2
(45) Date of Patent: Aug. 20, 2019

(54) SOLID-STATE IMAGE PICKUP APPARATUS AND ELECTRONIC APPARATUS

(71) Applicant: SONY SEMICONDUCTOR SOLUTIONS CORPORATION, Kanagawa (JP)

(72) Inventor: Hiroyuki Ohri, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 15/511,548

(22) PCT Filed: Sep. 14, 2015

(86) PCT No.: PCT/JP2015/075948
§ 371 (c)(1),
(2) Date: Mar. 15, 2017

(87) PCT Pub. No.: WO2016/047474
PCT Pub. Date: Mar. 31, 2016

(65) Prior Publication Data
US 2017/0287958 A1 Oct. 5, 2017

(30) Foreign Application Priority Data
Sep. 26, 2014 (JP) ................. 2014-196146

(51) Int. Cl.
H01L 27/146 (2006.01)
H04N 5/369 (2011.01)
H04N 5/3745 (2011.01)

(52) U.S. Cl.
CPC .... H01L 27/14614 (2013.01); H01L 27/1464 (2013.01); H01L 27/14636 (2013.01);
(Continued)

(58) Field of Classification Search
CPC ......... H01L 27/14614; H01L 27/14636; H01L 27/1464; H01L 27/14643; H04N 5/369; H04N 5/3742; H04N 5/3745
See application file for complete search history.

(56) References Cited

U.S. PATENT DOCUMENTS

2009/0251582 A1 10/2009 Oike
2012/0248580 A1* 10/2012 Matsugai ................ H01L 22/12
257/621
(Continued)

FOREIGN PATENT DOCUMENTS

JP 2009-268083 A 11/2009
JP 2013-031116 A 2/2013
JP 2013-033896 A 2/2013

OTHER PUBLICATIONS

International Search Report prepared by the Japan Patent Office dated Oct. 30, 2015, for International Application No. PCT/JP2015/075948.

Primary Examiner — Matthew C Landau
Assistant Examiner — Mark Hatzilambrou
(74) Attorney, Agent, or Firm — Sheridan Ross P.C.

(57) ABSTRACT

The present disclosure relates to a solid-state image pickup apparatus and an electronic apparatus capable of preventing charges accumulated in a PD from being lost and suppressing reductions of an S/N and a dynamic range. The apparatus according to an embodiment of the present disclosure includes: a photoelectric conversion unit; a first holding unit that holds the charge transferred from the photoelectric conversion unit; a first transfer gate unit that controls the transfer of the charge; a charge drain unit that is a drain destination of the charge generated by the photoelectric conversion unit; a first drain gate unit that controls the transfer of the charge from the photoelectric conversion unit to the charge drain unit; and a second drain gate unit that
(Continued)

connects the charge drain unit with a constant voltage source. The present disclosure can be applied to a CIS and an electronic apparatus provided with the CIS.

16 Claims, 19 Drawing Sheets

(52) U.S. Cl.
CPC ....... *H01L 27/14643* (2013.01); *H04N 5/369* (2013.01); *H04N 5/3745* (2013.01)

(56) References Cited

U.S. PATENT DOCUMENTS

2013/0001403 A1* 1/2013 Yamakawa ....... H01L 27/14609
250/208.1
2014/0232917 A1* 8/2014 Kawahito ............ H04N 5/3745
348/303

* cited by examiner

SOLID-STATE IMAGE PICKUP APPARATUS AND ELECTRONIC APPARATUS

CROSS REFERENCE TO RELATED APPLICATIONS

This application is a national stage application under 35 U.S.C. 371 and claims the benefit of PCT Application No. PCT/JP2015/075948 having an international filing date of 14 Sep. 2015, which designated the United States, which PCT application claimed the benefit of Japanese Patent Application No. 2014-196146 filed 26 Sep. 2014, the disclosures of which are incorporated herein by reference in their entirety.

TECHNICAL FIELD

The present disclosure relates to a solid-state image pickup apparatus and an electronic apparatus, and specifically relates to a solid-state image pickup apparatus and an electronic apparatus suitable for a CIS (CMOS Image Sensor) equipped with a global shutter function.

BACKGROUND ART

In related art, as a solid-state image pickup apparatus mounted on an image pickup apparatus such as a digital camera, a CIS is widely used. In a general CIS, pixel exposure and reading are performed on a row-by-row basis, so when an image of a subject moving quickly is taken, so-called focal plane distortion occurs.

In view of this, as a countermeasure against the occurrence of the focal plane distortion, a CIS equipped with a global shutter function capable of performing the pixel exposure and reading simultaneously for all pixels has been proposed (see, for example, Patent Literature 1).

FIG. 1 is a plan view showing an example of a basic structure in each unit pixel of a front-surface irradiation type CIS equipped with the global shutter function. FIG. 2 is a cross-sectional view corresponding to FIG. 1.

The unit pixel of a CIS 10 is formed of an HAD (Hole Accumulated Diode) structure, for example, and is provided with a photodiode (hereinafter, abbreviated to PD (the same holds true for the other components)) 11 that performs photoelectric conversion and a floating diffusion region (FD) 13 connected to the PD 11 via a transfer gate (TG) 12.

Further, in the unit pixel, via a overflow gate (OFG) 14, a charge drain region (overflow drain (OFD)) 15 connected to a constant voltage source VDD for resetting the PD 11 is disposed horizontally with respect to the PD 11.

The unit pixel is further provided with a reset transistor (RST), a select transistor (SEL), and an amplifier transistor (AMP) (not shown).

FD 13 holds charges generated in the PD 11, with the result that the global shutter function is achieved. It should be noted that, instead of the FD 13, a charge holding region that holds the charges generated in the PD 11 may be provided in some cases.

CITATION LIST

Patent Literature

Patent Literature 1: Japanese Patent Application Laid-open No. 2009-268083

DISCLOSURE OF INVENTION

Technical Problem

Incidentally, it is known that in the PD 11 of the CIS 10, most of charges generated and accumulated in the PD 11 are lost due to a transitional overflow phenomenon from when the TG 12 is set to on until reading is performed.

FIG. 3 is a diagram showing the state of an overflow phenomenon of charges. In the figure, a horizontal axis represents elapsed time, and a vertical axis represents the number of charges accumulated in the PD 11. As shown in the figure, the longer the elapsed time, the more the charges are lost. The number of accumulated charges is reduced. As a result, the overflow phenomenon of charges in the PD 11 becomes more serious in the case where exposure is performed for a long time.

For example, as in the case of taking an image of a luminous object at night, in such an image-taking condition that light is incident to such an extent that the PD 11 is saturated in an initial stage of an exposure time, and then it gets dark, charges accumulated in the initial stage are lost due to the overflow phenomenon. This is a factor of degrading an S/N and a dynamic range.

In particular, like the CIS 10 shown in FIG. 1, in the structure having the OFD 15, this problem worsens. This will be explained with reference to FIG. 4.

Normally, when the number of charges in the PD 11 is reduced, the potential of the PD 11 becomes deeper (higher). Because of so-called a DIBL effect (Drain-Induced Barrier Lowering), an overflow barrier (OFB) between the PD 11 and the OFD 15 becomes also deeper (higher). Then, the number of charges in the PD 11 is reduced due to the overflow phenomenon, and along with this, the overflow barrier is lowered. As a result, such a cycle that the charges are flown from the PD 11 to the OFD 15, and the accumulated charges are further reduced is continued. This becomes marked when pixels are miniaturized, because the distance between the PD 11 and the OFD 15 is reduced.

The present disclosure has been made in view of the circumstances as described above, and has an object to prevent charges accumulated in the PD from being lost and suppress reductions in S/N and dynamic range.

Solution to Problem

According to a first aspect of the present disclosure, there is provided a solid-state image pickup apparatus including: a photoelectric conversion unit that generates a charge depending on incident light; a first holding unit that holds the charge transferred from the photoelectric conversion unit; a first transfer gate unit that controls the transfer of the charge from the photoelectric conversion unit to the first holding unit; a charge drain unit that is a drain destination of the charge generated by the photoelectric conversion unit; a first drain gate unit that controls the transfer of the charge from the photoelectric conversion unit to the charge drain unit; and a second drain gate unit that connects the charge drain unit with a constant voltage source.

The solid-state image pickup apparatus according to the first aspect of the present disclosure can further include: a second holding unit that holds the charge transferred from the photoelectric conversion unit between the photoelectric conversion unit and the first holding unit; and a second transfer gate unit that controls the transfer of the charge from the photoelectric conversion unit to the second holding unit.

The second transfer gate unit can be constituted of one or more gates.

The second drain gate unit can be formed in an area different from a pixel portion.

The second drain gate unit can be formed in a wiring layer.

The second drain gate unit can be formed in the wiring layer as a transistor of an oxide semiconductor.

The second drain gate unit can have a gate voltage in an exposure time of the photoelectric conversion unit which is set to a value between a negative voltage in a non-conduction state and a power supply voltage in a conduction state.

The second drain gate unit can have a drain voltage in an exposure time of the photoelectric conversion unit which is set to a value between 0 V and a power supply voltage in a conduction state.

The solid-state image pickup apparatus can be a front-surface irradiation type.

The solid-state image pickup apparatus can be a back-surface irradiation type.

The solid-state image pickup apparatus can be a lamination type.

According to a second aspect of the present disclosure, there is provided an electronic apparatus on which a solid-state image pickup apparatus is mounted. The solid-state image pickup apparatus includes a photoelectric conversion unit that generates a charge depending on incident light, a first holding unit that holds the charge transferred from the photoelectric conversion unit, a first transfer gate unit that controls the transfer of the charge from the photoelectric conversion unit to the first holding unit, a charge drain unit that is a drain destination of the charge generated by the photoelectric conversion unit, a first drain gate unit that controls the transfer of the charge from the photoelectric conversion unit to the charge drain unit, and a second drain gate unit that connects the charge drain unit with a constant voltage source.

In the first and second aspects of the present disclosure, the potential of the charge drain unit as the drain destination of the charge generated in the photoelectric conversion unit is floating in the case where the second drain gate unit is in the non-conduction state.

Advantageous Effects of Invention

According to the first and second aspects of the present disclosure, it is possible to suppress the loss of the charges accumulated in the first holding unit.

MODE(S) FOR CARRYING OUT THE INVENTION

Hereinafter, best modes for carrying out the present disclosure (hereinafter, referred to as embodiments) will be described in detail with reference to the drawings.

<First Configuration Example of CIS According to this Embodiment>

Figure 1:
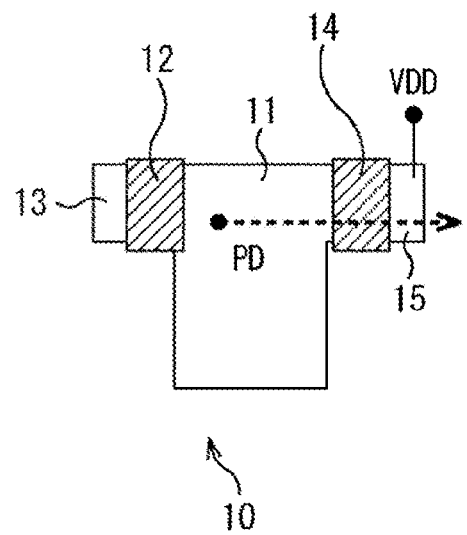
FIG. 1 A plan view showing an example of a basic configuration of a front-surface irradiation type CIS that achieves a global shutter function.
Figure 2:
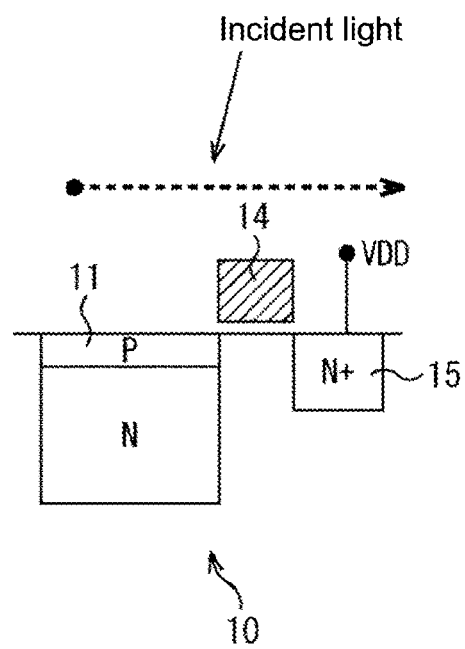
FIG. 2 A cross-sectional view corresponding to FIG. 1.
Figure 3:
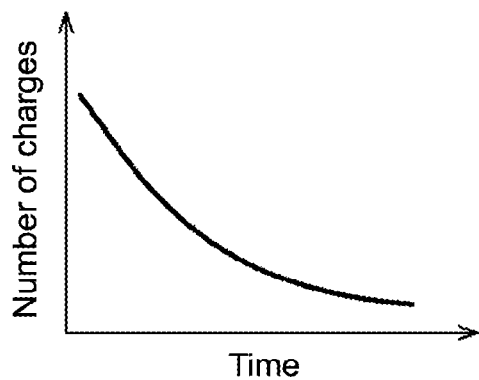
FIG. 3 A diagram for explaining a transitional overflow phenomenon of charges in a PD.
Figure 4:
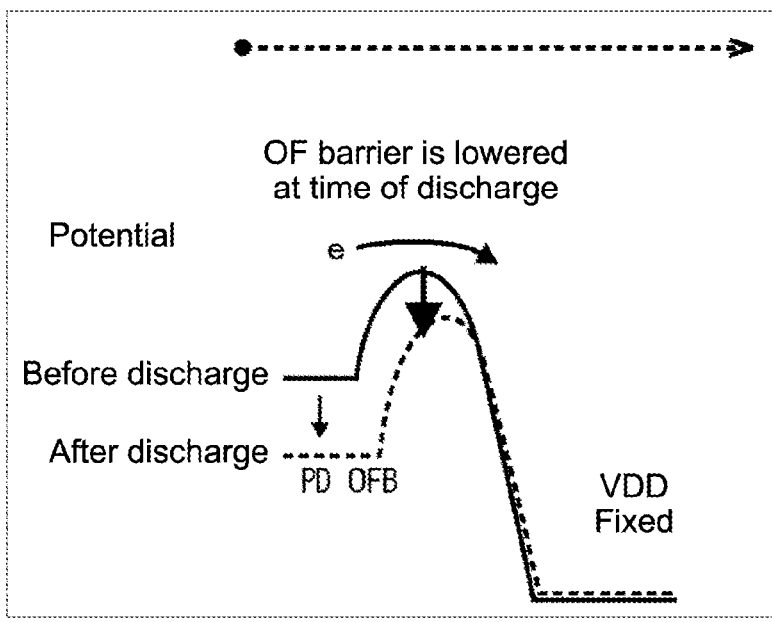
FIG. 4 A diagram for explaining a degradation of the overflow phenomenon in the case of providing an overflow drain.
Figure 5:
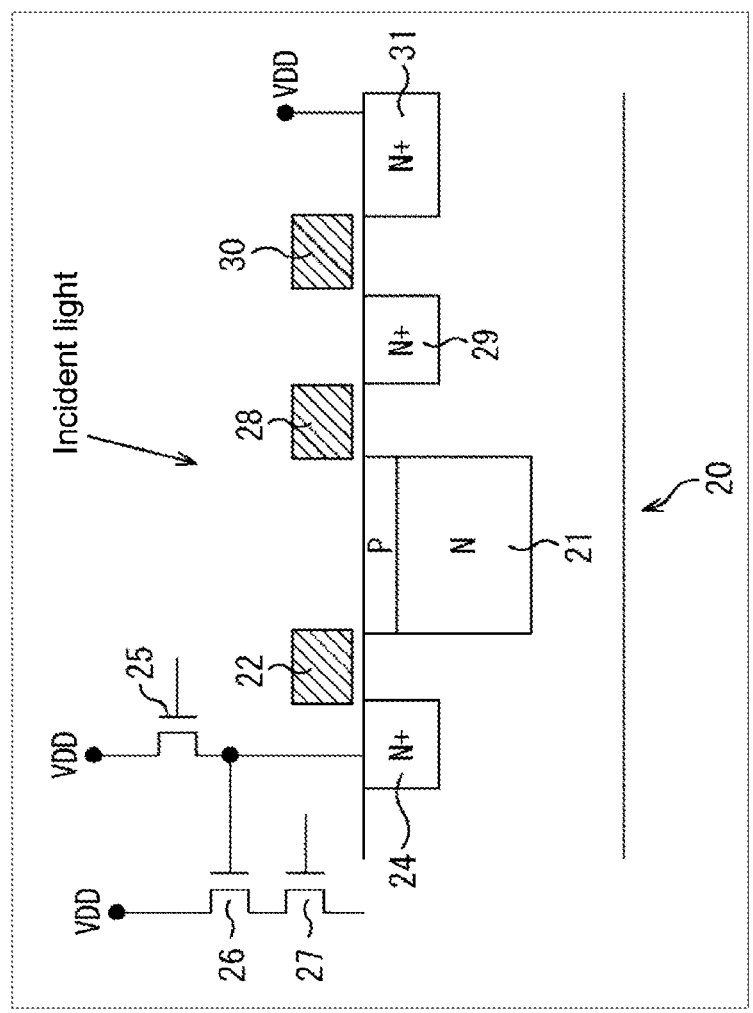
FIG. 5 A cross-sectional view showing a first configuration example of a CIS to which the present disclosure is applied.
Figure 6:
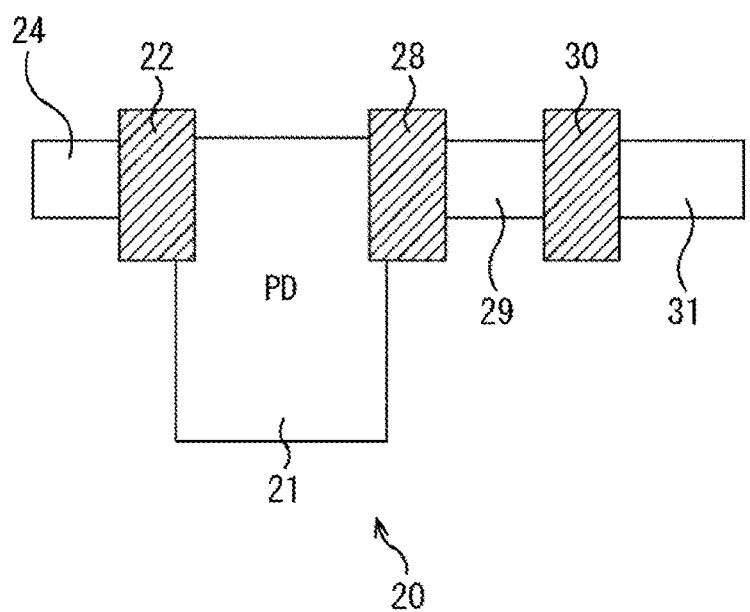
FIG. 6 A plan view showing the first configuration example of the CIS.
Figure 7:
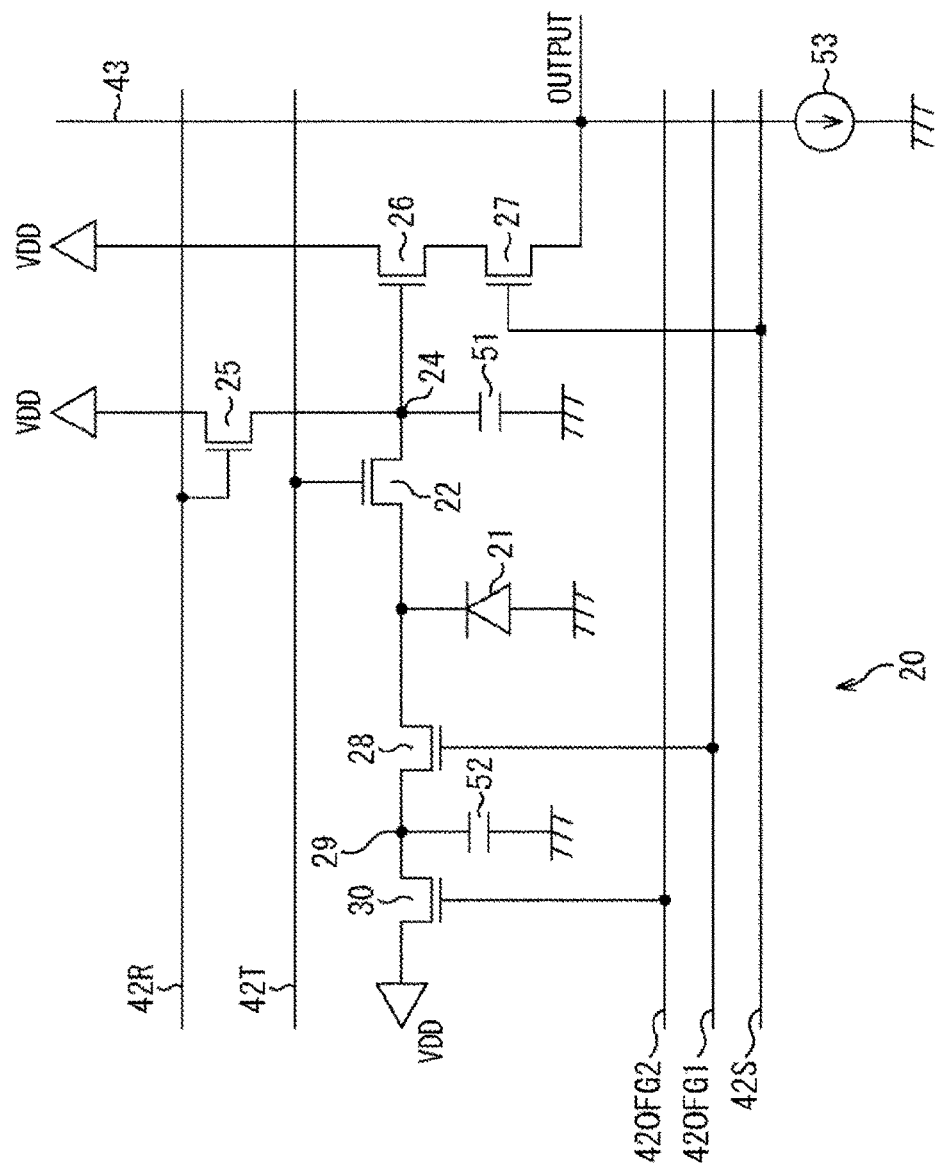
FIG. 7 An equivalent circuit diagram showing the first configuration example of the CIS.

FIG. 5 is a cross-sectional view showing a configuration example of a front-surface irradiation type CIS according to this embodiment. FIG. 6 is a plan view corresponding to FIG. 5. FIG. 7 is an equivalent circuit diagram corresponding to FIG. 5.

A CIS 20 is provided with a photodiode (PD) 21, a transfer gate (TG) 22, a floating diffusion region (FD) 24, a reset transistor (RST) 25, an amplifier transistor (AMP) 26, and a select transistor (SEL) 27. The CIS 20 is further provided with an OFG 28, a charge drain region (OFD) 29, a control gate (OFG) 30, and a charge drain region (OFD) 31.

For the PD 21, an anode terminal is grounded, and a cathode terminal is connected to the FD 24 through the TG 22. Further, the cathode terminal of the PD 21 is connected to the OFD 29 through the control gate (control transistor) 28. The OFD 29 is grounded through a capacitor 52, and is connected to a constant voltage source VDD through the control gate (control transistor) 30.

The FD 24 is grounded through a capacitor 51, connected to the constant voltage source VDD through the RST 25, and further connected to a gate electrode of the AMP 26. For the AMP 26, one terminal is connected to the constant voltage source VDD, and the other terminal is connected, through the SEL 27, to a vertical signal line 43 connected to a constant current source 53.

To a gate electrode of the TG 22, a horizontal signal line 42T is connected. To a gate electrode of the SEL 27, a horizontal signal line 42S is connected. To a gate electrode of the RST 25, a horizontal signal line 42R is connected. To a gate electrode of the OFD 28, a horizontal signal line 42OFG1 is connected. To a gate electrode of the OFG 30, a horizontal signal line 42OFG2 is connected.

<Drive Timing of CIS 20>

During an exposure time, in the CIS 20, the OFG 28 and the OFG 30 are off, and the OFD 29 is in an electrically floating state. At a time of resetting the PD 21, the OFG 28 and OFG 30 are set to on, and the PD 21 is connected to the constant voltage source VDD.

Figure 8:
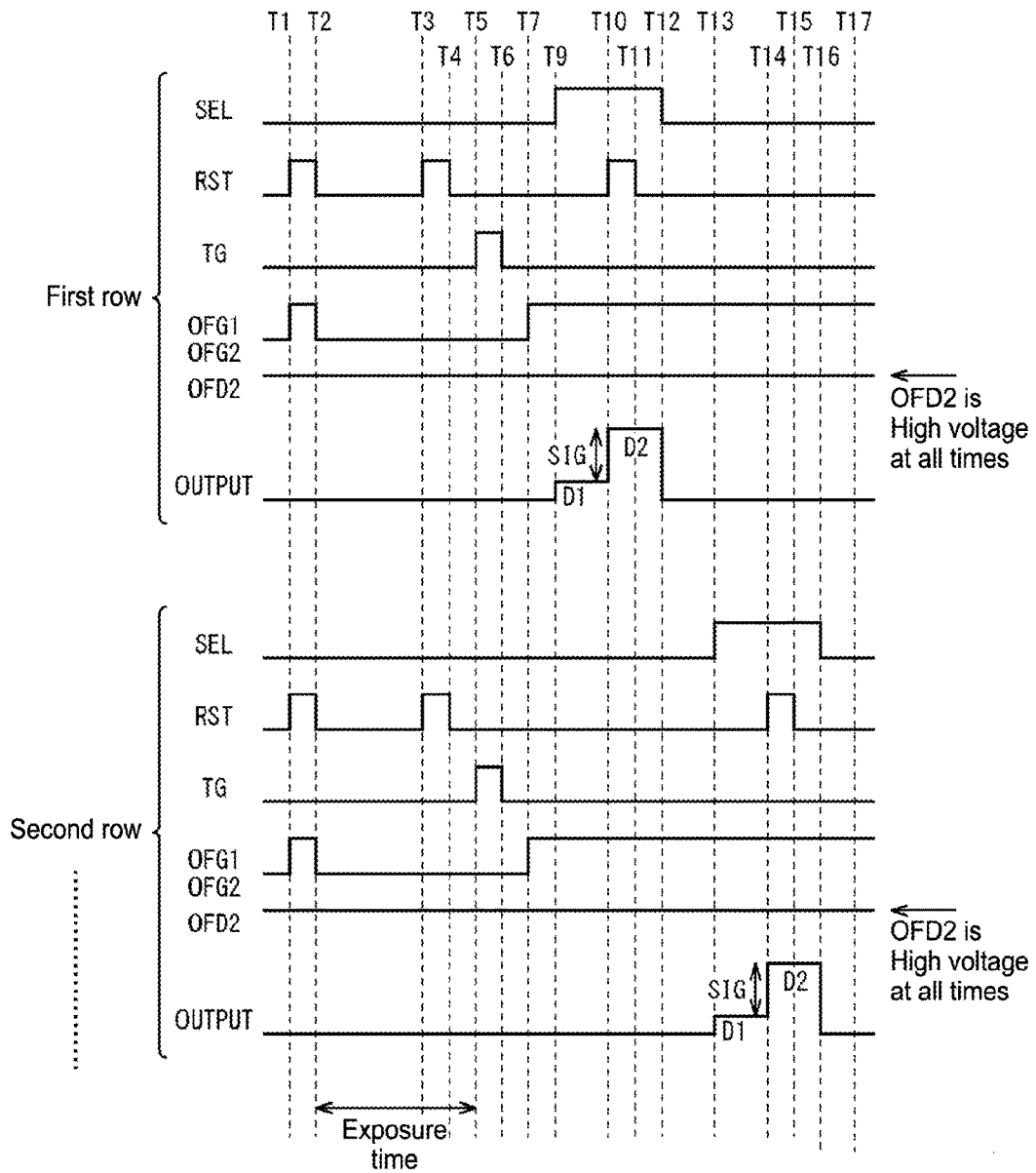
FIG. 8 A timing chart showing drive timings in the first configuration example of the CIS.

This will be more specifically described. FIG. 8 is a timing chart showing drive timings of the CIS 20. In the figure, SEL and the like indicate control signals to be input to the gate electrodes of the transistors such as the SEL 27, and can have two values of High level (the same meaning as on) or Low level (the same meaning as off). OFG1 and OFG2 indicate control signals to be input to the gate electrodes of the OFG 28 or the OFG 30. Further, OFD2 indicates a level of a voltage (constant voltage VDD) to be applied to the OFD 31.

First, at time T1, for pixels of all rows, at the same time, the FD 24, and the OFD 29, a reset signal RST, and drain signals OFG1 and OFG2 are set to High level in order to reset the PD 21.

In accordance with the reset signal RST at High level, the RST 25 is set to on, and the FD 24 is reset. Further, in accordance with the drain signal OFG1 at High level, the OFG 28 is set to on, and in accordance with the drain signal OFG2 at High level, the OFG 30 is set to on. Then, charges accumulated in the PD 21 are drained to the constant voltage source VDD.

At time T2, for pixels of all rows, at the same time, the reset signal RST and the drain signals OFG1 and OFG2 are set to Low level, and the RST 25, the OFG 28, and the OFG 30 are set to off. As a result, the reset of the PD 21, the FD 24, and the OFD 29 is completed, and for the pixels of all rows, the exposure of the PD 21 is started at the same time.

At time T3, for pixels of all rows, at the same time, the reset signal RST is set to High level, and at time T4, the reset signal RST is set to Low level. As a result, the RST 25 is set to on, and charges generated due to a junction leakage mainly in the FD 24 during the exposure time are drained from the FD 24.

At time T5, for pixels of all rows, at the same time, a transfer signal TG is set to High level. In accordance with this, the TG 22 is set to on. As a result, the exposure of the pixels is terminated, and in the pixels of all rows, the charges accumulated in the PD 21 are transferred to the FD 24 at the same time. The transfer operation is performed in all the pixels at the same time, with the result that a global shutter operation is carried out.

At time T6, for all the pixels, at the same time, the transfer signal TG is set to Low level. In accordance with this, the TG 22 is set to off, and the transfer of the charges is completed.

Subsequently, at time T7, for all the pixels, at the same time, the drain signals OFG1 and OFG2 are set to High level. After that, the drain signals OFG1 and OFG2 are maintained to be High level. As a result, the charges generated in the PD 21 are continuously drained to the constant voltage source VDD, thereby making it possible to suppress accumulation of extra charges in the PD 21.

It should be noted that, the operations from time T1 to time T7 are performed at the same timing for all the pixels. The charges generated in the PD 21 are accumulated in the capacitor 51, and then, the charges are read sequentially on a row-by-row basis.

Specifically, for example, a period from time T9 to time T12 is a read time for charges on the first row, and a period from time T13 to time T17 is a read time for charges on the second row. Then, similarly, charges of the pixels on a row in a read time are read sequentially up to the last row.

That is, at time T9, for the pixels on the first row, the selection signal SEL is set to High level. In accordance with this, the SEL 27 is set to on, charges to be read can be output through the vertical signal line 43. Then, after an output voltage is stabilized, a signal that indicates a level corresponding to the charges accumulated in the capacitor 51 is output as a signal D1.

At time T10, for the pixels on the first row, the reset signal RST is set to High level. In accordance with this, the RST 25 is set to on. As a result, charges accumulated in the FD 24 are drained to the constant voltage source VDD, and the FD 24 is reset.

Subsequently, at time T11, for the pixels on the first row, the reset signal RST is set to Low level. In accordance with this, the RST 25 is set to off, and thus the reset of the FD 24 is completed. Then, after an output voltage is stabilized, a signal that indicates the reset level of the capacitor 51 is output as a signal D2.

Further, at time T12, for the pixels on the first row, the selection signal SEL is set to Low level, and the SEL 27 is set to off. Thus, the read time for the pixels on the first row is terminated.

It should be noted that, a difference between the signal D1 output at time T9 and the signal D2 output at time T10 is set as an output signal SIG that indicates a level corresponding to the charges generated in the PD 21.

In a similar way, a period from time T13 to time T16 is set as a read time for pixels on the second row, and the output signal SIG is output. Subsequently, the similar operation is repeatedly performed for the pixels of all the rows, and the pixel signal is output from each of all the rows.

Figure 9:
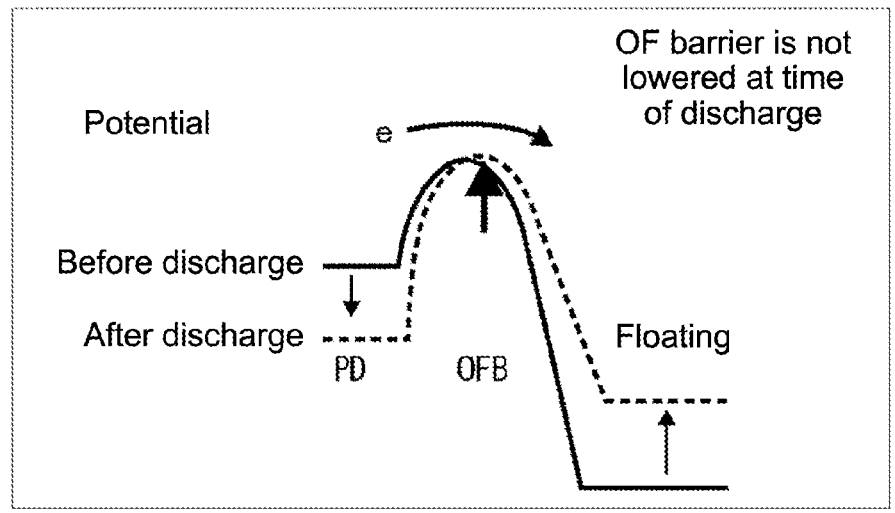
FIG. 9 A diagram for explaining an effect of the present disclosure.
Figure 10:
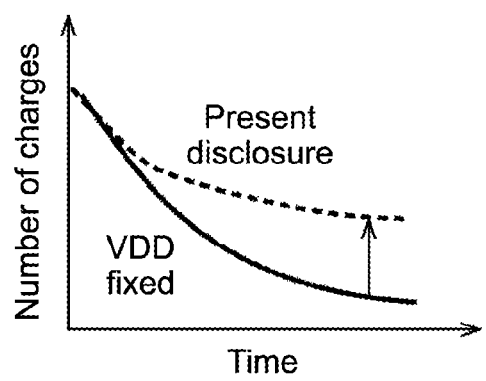
FIG. 10 A diagram for explaining an effect of the present disclosure.

As described above, in the CIS 20, to cause the OFD 29 to be in the electrically floating state, as shown in FIG. 9, the potential of the OFD 29 is lowered, when the charges are overflown from the PD 21. The lowering of the potential of the OFD 29 suppresses lowering of a barrier of the OFB between the PD 21 and the OFD 29 due to the potential of the PD 21. As a result, as shown in FIG. 10, a loss of the charges accumulated in the PD 21 with time is suppressed, and thus the degradation of the S/N, dynamic range, or the like can be suppressed.

<Second Configuration Example of CIS According to this Embodiment>

Figure 11:
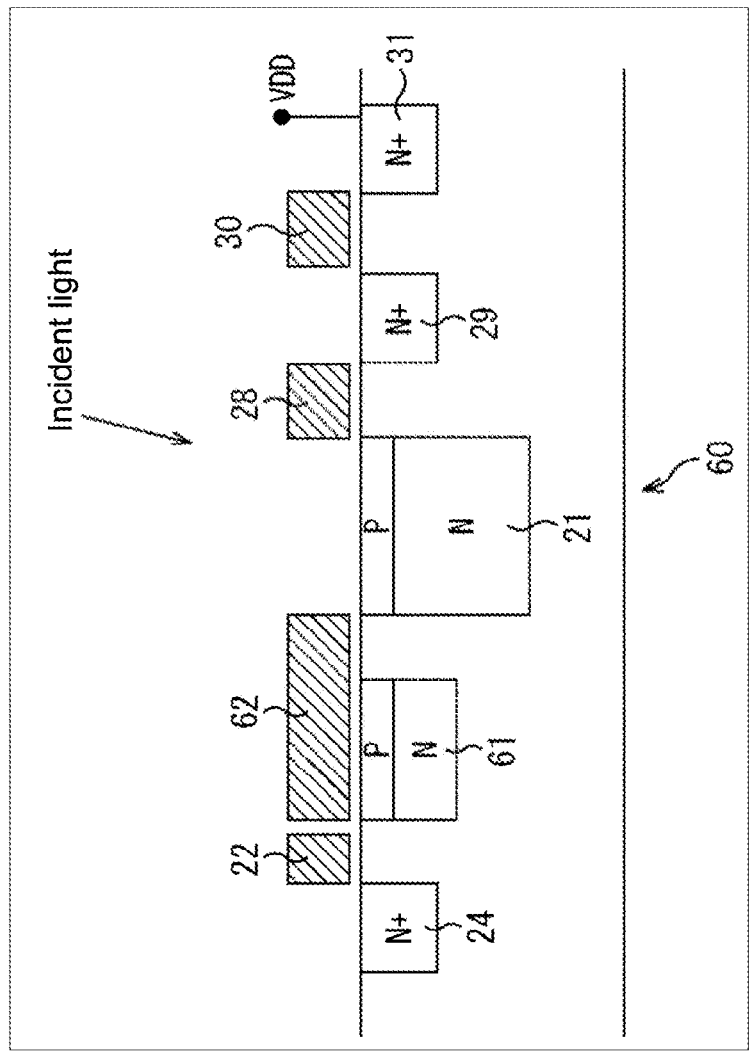
FIG. 11 A cross-sectional view showing a second configuration example of the CIS to which the present disclosure is applied.
Figure 12:
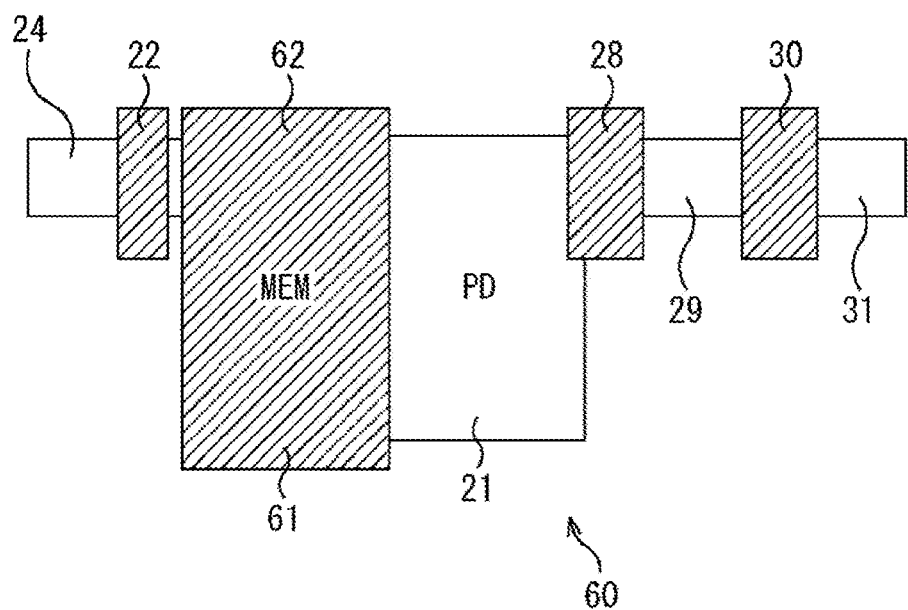
FIG. 12 A plan view showing the second configuration example of the CIS.

Subsequently, FIG. 11 is a cross-sectional view showing another configuration example (second configuration example) of a unit pixel of the front-surface irradiation type CIS according to this embodiment. FIG. 12 is a plan view corresponding to FIG. 11.

A CIS 60 as a second configuration example is obtained by adding a charge holding region (MEM) 61 between the PD 21 and the FD 24 of the CIS 20 as the first configuration example. It should be noted that, components of the CIS 60 as the second configuration example which are common to the components of the CIS 20 as the first configuration example are denoted by the same symbols, so a description of those will be omitted as appropriate.

The MEM 61 is formed to have an impurity concentration similar to the PD 21, and is connected to the PD 21 through a gate (TX) 62.

The CIS 60 is provided with the MEM 61, with the result that, in addition to the effect obtained by the CIS 20, such an effect can be obtained that a noise due to a dark current during when the charges are held after a simultaneous transfer for all the pixels can be suppressed.

<Third Configuration Example of CIS According to this Embodiment>

Figure 13:
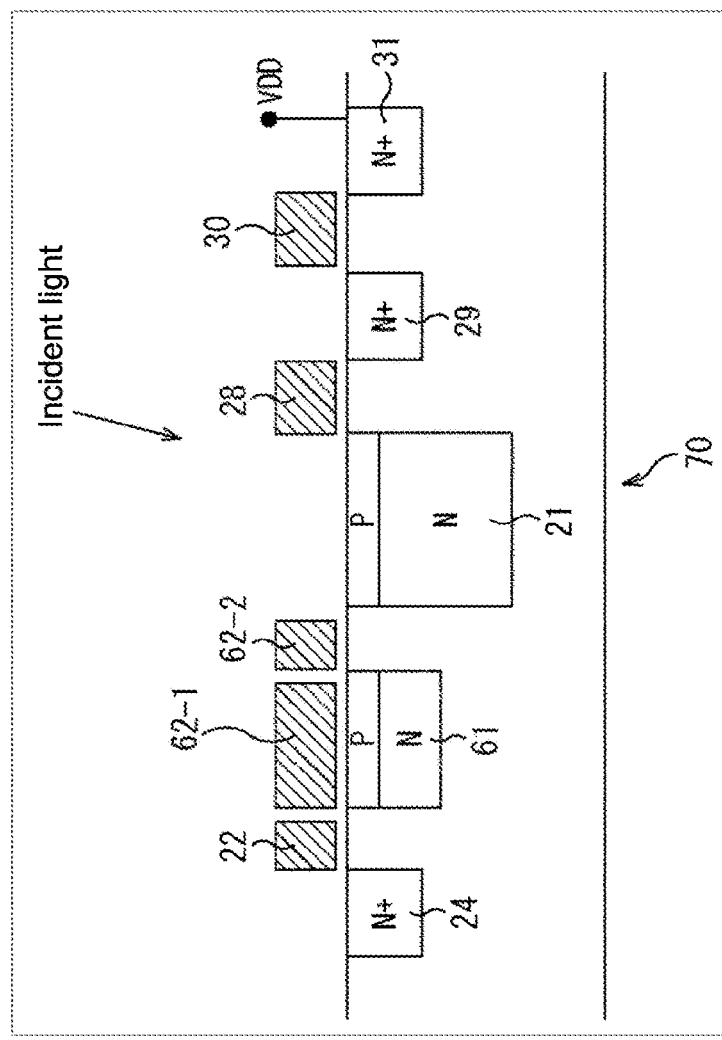
FIG. 13 A cross-sectional view showing a third configuration example of the CIS to which the present disclosure is applied.
Figure 14:
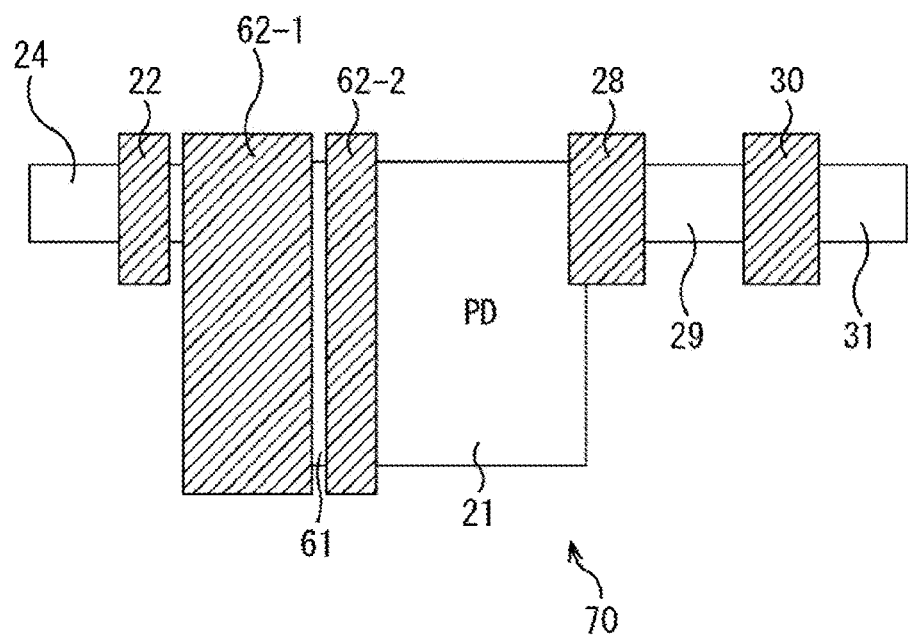
FIG. 14 A plan view showing the third configuration example of the CIS.

Subsequently, FIG. 13 is a cross-sectional view showing another configuration example (third configuration example) of the unit pixel of the front-surface irradiation type CIS according to this embodiment. FIG. 14 is a plan view corresponding to FIG. 13.

A CIS 70 as the third configuration example is obtained by dividing the TX 62 of CIS 60 as the second configuration example into a TX 62-1 and a TY 62-2. It should be noted that components of the CIS 70 as the third configuration example which are common to the components of the first and the second configuration examples are denoted by the same symbols, so a description of those will be omitted as appropriate.

The TX 62-1 performs a transfer of charges from the PD 21 to the MEM 61 and a hole induction onto an Si surface at a time when the MEM 61 holds the charges. The TY 62-2 suppresses the charges from returning to the PD 21 after the charges are transferred from the PD 21 to the MEM 61.

The CIS 70 is provided with the TX 62-1 and the TY 62-2, with the result that, in addition to the effect obtained by the CIS 20 and the CIS 60, such an effect can be obtained that the charges are easily suppressed from returning to the PD 21 after the transfer of the charges from the PD 21 to the MEM 61, leading to an improvement of a saturation charge amount.

<Fourth Configuration Example of CIS According to this Embodiment>

Figure 15:
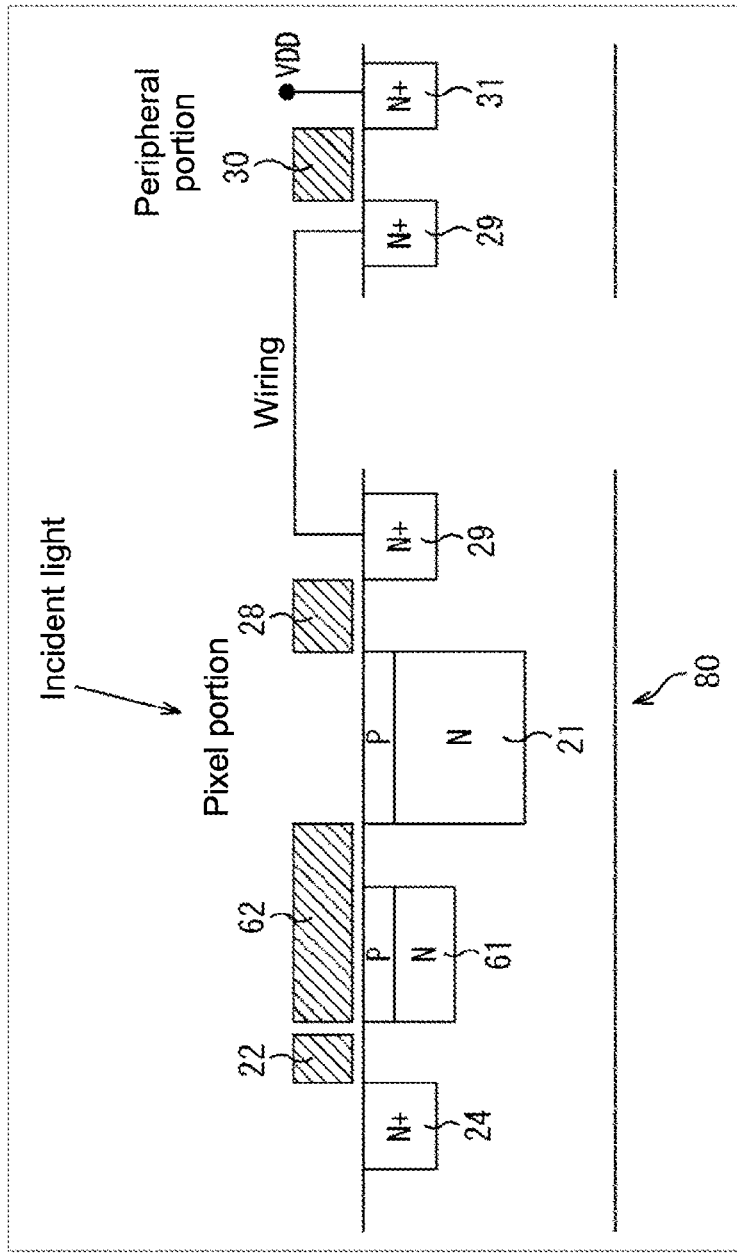
FIG. 15 A cross-sectional view showing a fourth configuration example of the CIS to which the present disclosure is applied.

Subsequently, FIG. 15 is a cross-sectional view showing another configuration example (fourth configuration example) of the unit pixel of the front-surface irradiation type CIS according to this embodiment.

A CIS 80 as the fourth configuration example is obtained by forming the control transistor (transistor structure constituted of the OFD 29, the OFG 30, and the OFD 31) that connects the OFD 29 and the OFD 31 not in a pixel portion where the unit pixel is disposed but in a different area (peripheral portion of a pixel or element isolation area between pixels).

The CIS 80 does not have the control transistor in the pixel portion, and therefore can obtain an effect similar to the CIS 60 without affecting the area of the PD 21.

<Fifth Configuration Example of CIS According to this Embodiment>

Figure 16:
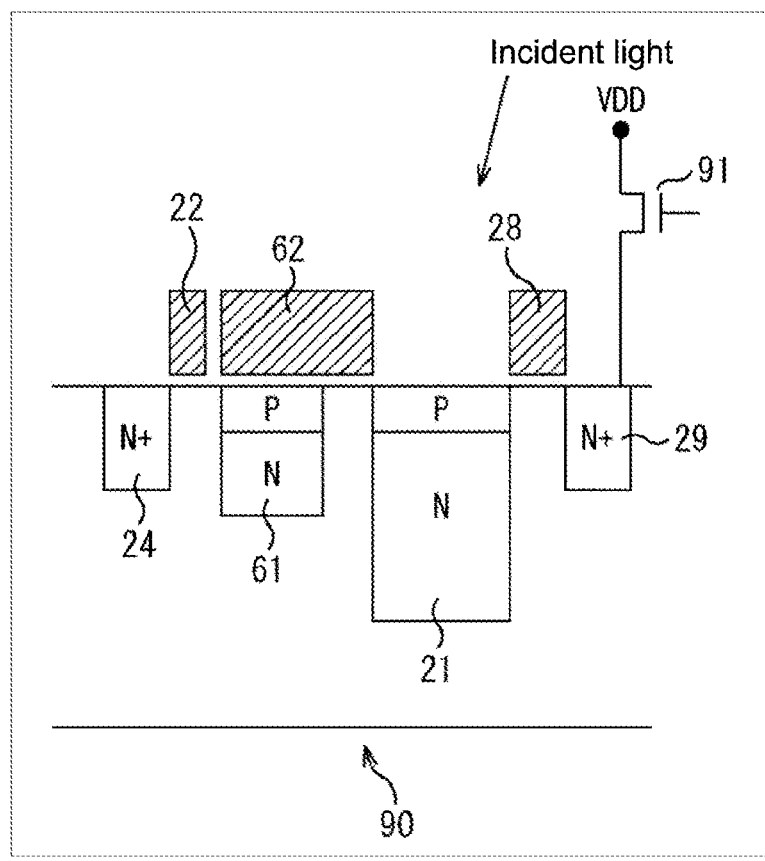
FIG. 16 A cross-sectional view showing a fifth configuration example of the CIS to which the present disclosure is applied.

Subsequently, FIG. 16 is a cross-sectional view showing another configuration example (fourth configuration example) of the unit pixel of the front-surface irradiation type CIS according to this embodiment.

A CIS 90 as the fifth configuration example is obtained by forming the control transistor that is disposed in the area excluding the pixel portion in the CIS 80 as the fourth configuration example in a wiring layer on an upper layer side of a Si substrate where the pixel portion is formed. A control transistor 90 is formed of a thin-film transistor made of an oxide semiconductor material or the like in the wiring layer.

For the gate electrode and the metal wiring of the thin-film transistor as the control transistor 90, for example, Al, Cu, Ti, Mo, W, Cr, a nitride thereof, an oxide thereof, a transparent metal such as ITO and ZnO, or a laminate structure of a plurality of metals out of those can be adopted. Further, for a gate insulation film, a Si oxide, a Si nitride, a Hf oxide, an Al oxide, a Ta oxide, or a laminate structure of those can be adopted. As a semiconductor layer, a ZnO, a SnO, an InO, a material obtained by adding Ga thereto, or an oxide semiconductor containing a plurality of elements out of those can be adopted.

The CIS 90 can obtain an effect similar to the CIS 60 without affecting the area of the PD 21.

<About Setting of Gate Voltage of Control Gate (OFG) 30>

Figure 17:
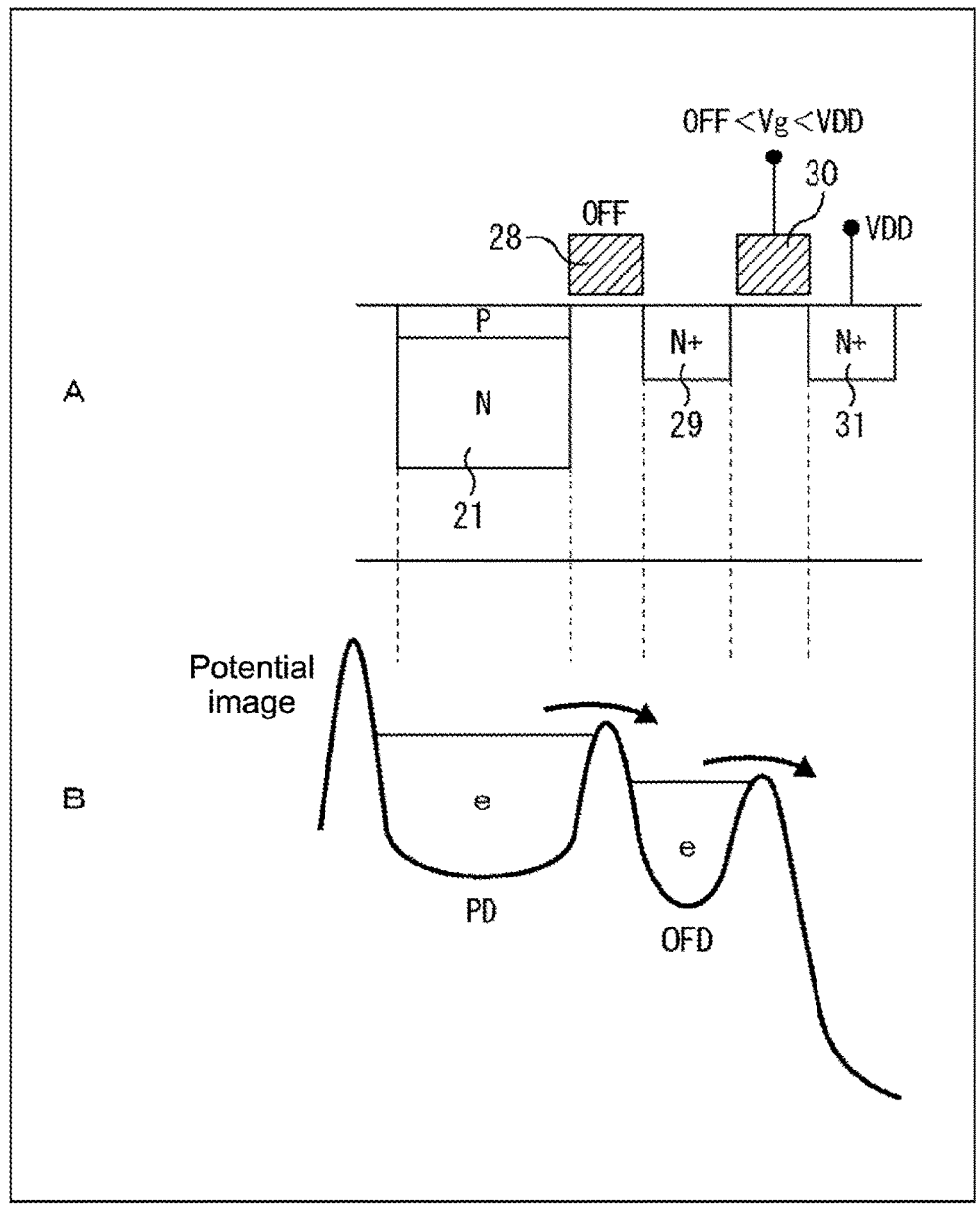
FIG. 17 A diagram for explaining a gate voltage setting for a control gate 30.
Figure 18:
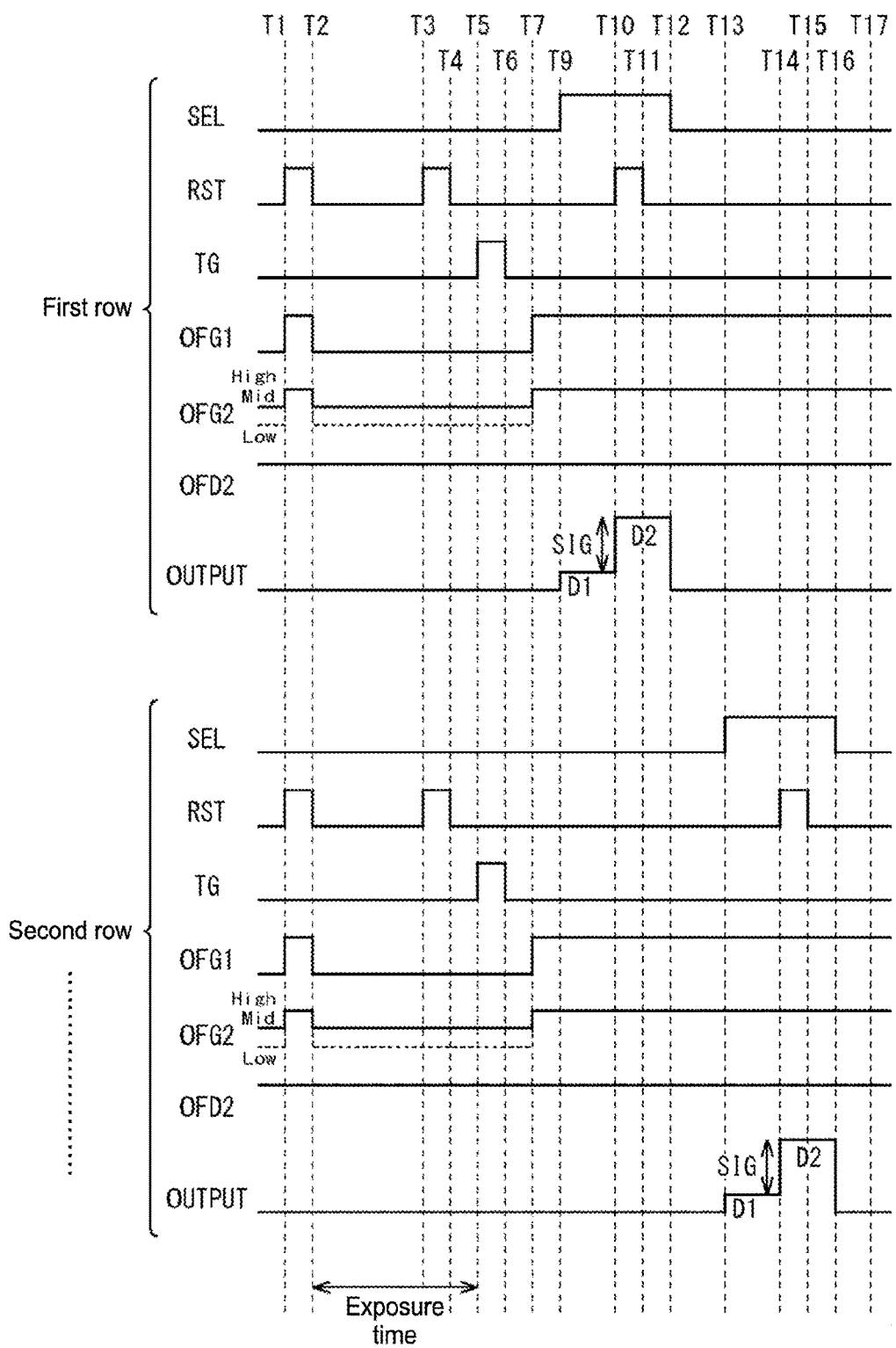
FIG. 18 A timing chart corresponding to the case shown in FIG. 17.

Subsequently, FIG. 17 is a diagram for explaining a change of setting of a gate voltage Vg of the control gate (OFG) 30 such as the CIS 20. FIG. 18 is a drive timing chart corresponding to the case of FIG. 17.

As shown in FIG. 17, the gate voltage Vg of the OFG 30 is set in such a manner that a potential barrier under the OFG 28 is higher than a potential barrier under the OFG 30. Specifically, the drain signal OFG2 with respect to the OFG 30 that can have the two values of High level (the same meaning as on) or Low level (the same meaning as off) in the description of the drive timings described with reference to FIG. 8 is changed to the setting as follows. That is, as shown in FIG. 18, the drain signal can have two values of High level (the same meaning as on) or Mid, which is an intermediate level between High level and Low level. The other control signals are the same as in the case shown in FIG. 8.

Then, as shown in FIG. 18, during the exposure time of the PD 21, the gate voltage Vg of the OFG 30 is set to the intermediate potential Mid between a negative voltage in the case where the OFG 30 is off and the constant voltage VDD of a constant voltage source in the case where the OFG 30 is on. As a result, it is possible to perform draining to the OFD 31 connected to the constant voltage source VDD without causing extra charges to leak into the holding region or an adjacent pixel even when a large amount of light enters the PD 21.

<About Applied Voltage Setting for Charge Drain Region (OFD) 31>

Figure 19:
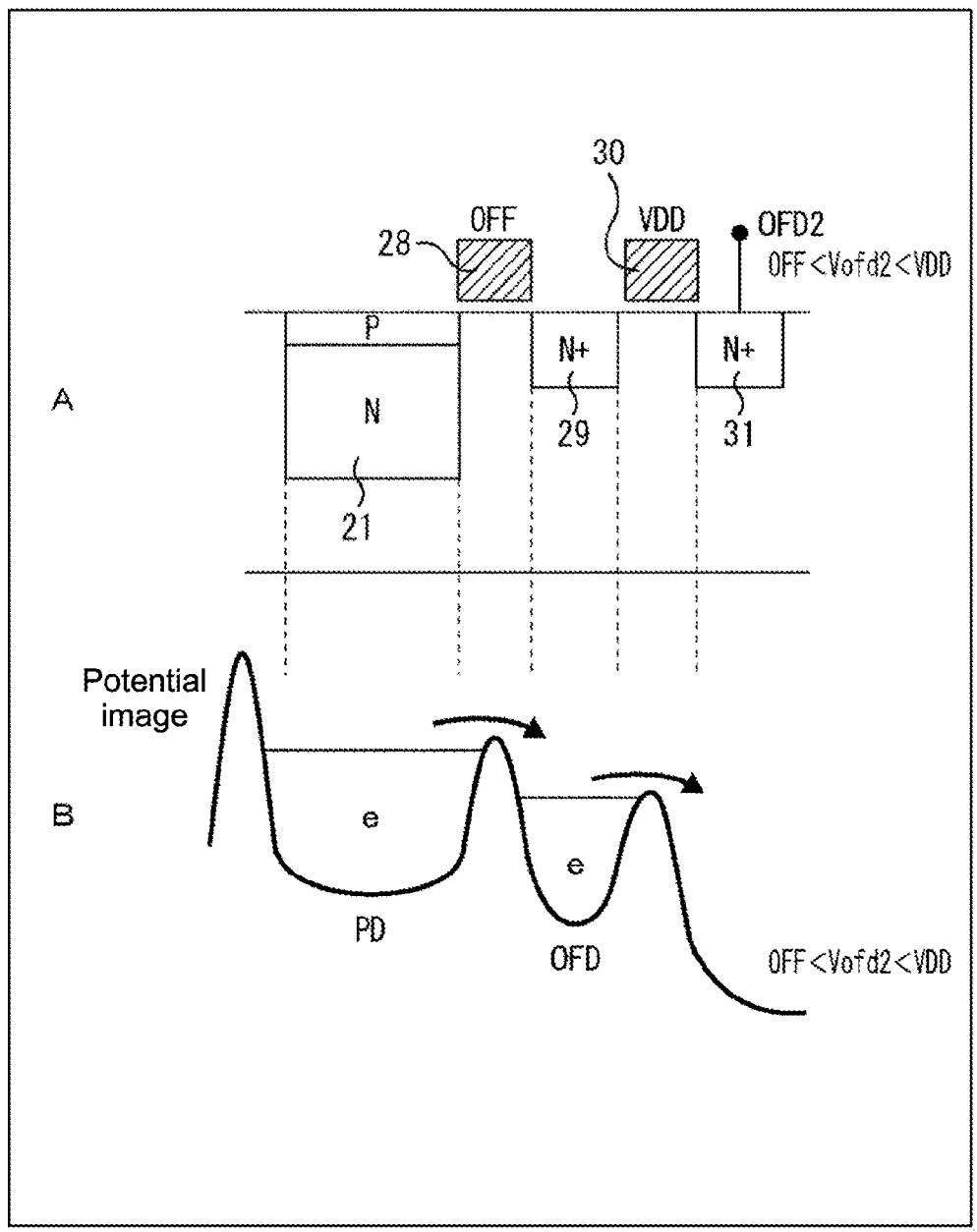
FIG. 19 A diagram for explaining an applied voltage setting with respect to a charge drain region 31.
Figure 20:
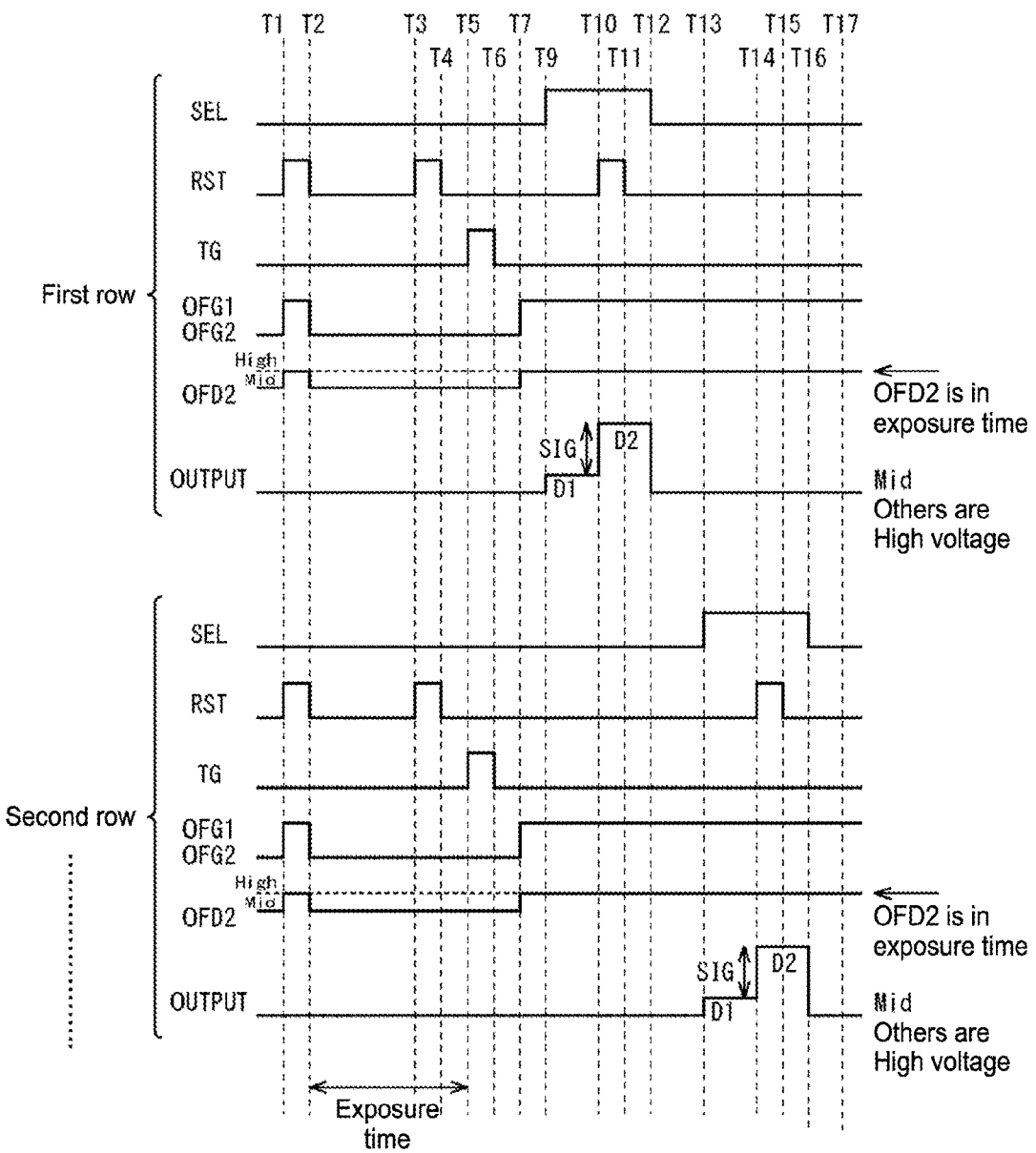
FIG. 20 A timing chart corresponding to the case shown in FIG. 19.

Subsequently, FIG. 19 is a diagram for explaining a change of the setting of an applied voltage to the charge drain region (OFD) 31 such as the CIS 20. FIG. 20 is a timing chart that showing drive timings corresponding to the case of FIG. 19.

As shown in FIG. 19, the voltage of the power source connected to the OFD 31 is set in such a manner that the potential barrier under the OFG 28 is higher than the potential barrier under the OFG 30. Specifically, the drain voltage with respect to the OFD 31 that is maintained to be the constant voltage VDD in the description of the drive timings described with reference to FIG. 8 is changed to the setting as follows. That is, as shown in FIG. 20, the drain voltage can have two values of a maximum voltage VDD or the intermediate potential Mid between the maximum voltage VDD and 0 V at a time of off. The other control signals are the same as in the case shown in FIG. 8.

Then, as shown in FIG. 20, during the exposure time of the PD 21, the applied voltage (drain voltage) to the OFD 31 is set to the intermediate potential Mid. As a result, it is possible to perform draining to the OFD 31 without causing extra charges to leak into the holding region or an adjacent pixel even when a large amount of light enters the PD 21.

<Application of the Present Disclosure to Back-Surface Irradiation Type CIS>

The first to sixth configuration examples described above are the front-surface irradiation type CISs. Further, the present disclosure can be also applied to a back-surface irradiation type CIS.

Figure 21:
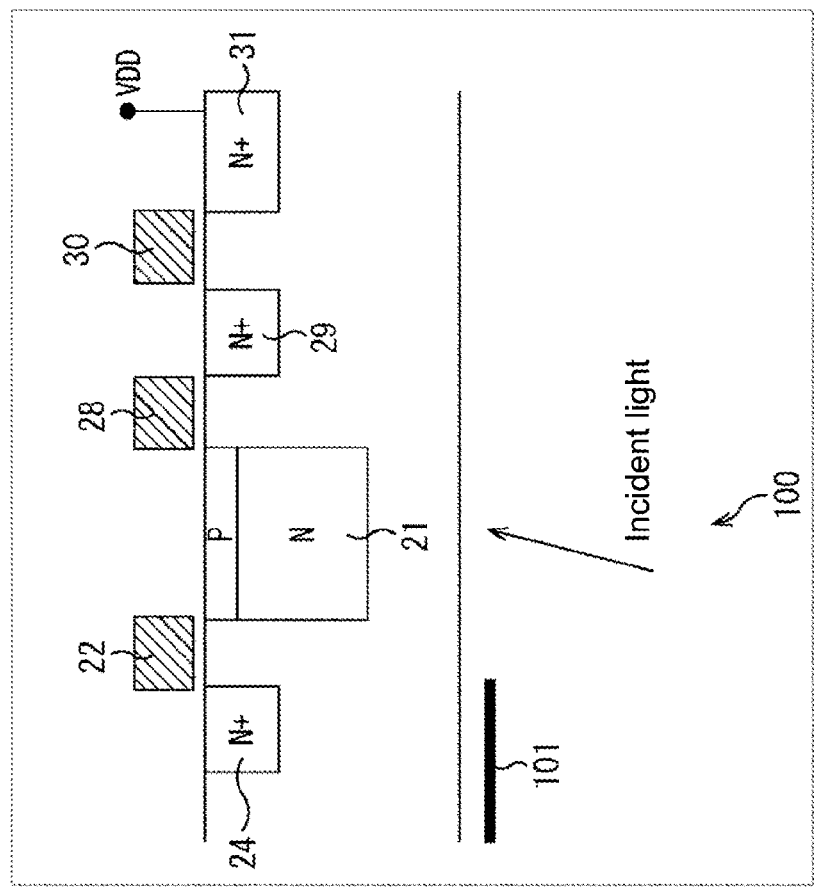
FIG. 21 A cross-sectional view showing a sixth configuration example of the CIS to which the present disclosure is applied.

FIG. 21 is a cross-sectional view showing a configuration example (seventh configuration example) of the unit pixel of the back-surface irradiation type CIS according to this embodiment. A back-surface irradiation type CIS 100 as the seventh configuration example is obtained by adding a light shielding film 101 made of a metal layer to the CIS 20 as the second configuration example shown in FIG. 5. The light shielding film 101 is formed so as to cover at least the FD 24. In the CIS 100, in addition to the effect obtained by the CIS 20, it is possible to eliminate limitation of light correction due to vignetting in the wiring layer, because incident light does not pass through the wiring layer.

Figure 22:
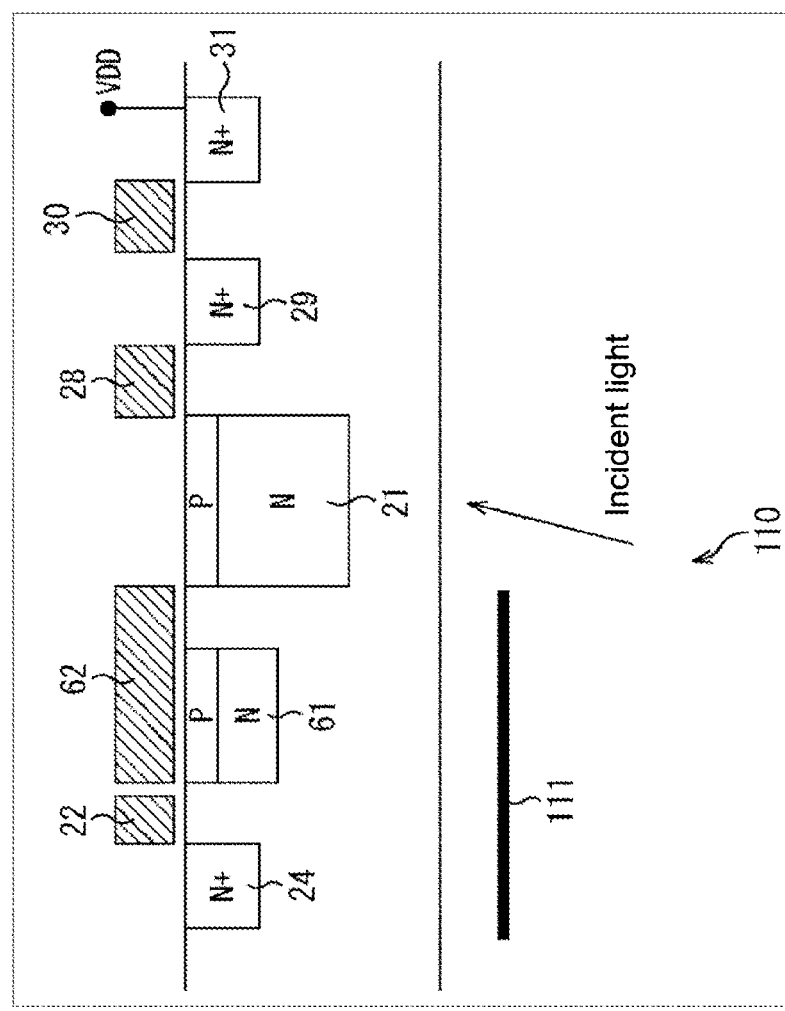
FIG. 22 A cross-sectional view showing a seventh configuration example of the CIS to which the present disclosure is applied.

FIG. 22 is a cross-sectional view showing another configuration example (eighth configuration example) of the unit pixel of the back-surface irradiation type CIS according to this embodiment. A back-surface irradiation type CIS 110 as the eighth configuration example is obtained by adding a light shielding film 111 made of a metal layer to the CIS 60 as the second configuration example shown in FIG. 11. The light shielding film 111 is formed so as to cover at least the FD 24 and the MEM 61. In the CIS 110, in addition to the effect obtained by the CIS 60, it is possible to eliminate limitation of light correction due to vignetting in the wiring layer.

Modified Example

The conductivity types on the Si substrate are not limited to that shown in the figures, and the N-type layer and the P-type layer may be inverted. For example, in the case where a hole is used as the signal charge, in an N-well, a charge holding region and a PD made of a P-type layer may be formed.

The CISs according to this embodiment can of course be applied to an image pickup apparatus such as a camera, and can be applied to any kinds of electronic apparatuses having an image pickup function.

The present disclosure may be a 3-transistor type or a 4-transistor type.

Further, the present disclosure can also be applied to a CIS of multiple pixel sharing type, in which an electrode, an FD, or the like is shared by a plurality of pixels.

Furthermore, the present disclosure can also be applied to a lamination type CIS in which a substrate on which a sensor circuit is formed and a substrate on which a logic circuit is formed are laminated.

The present disclosure is not limited to the above embodiment and can be various modified without departing from the gist of the present disclosure.

The present disclosure can also have the following configurations.

(1) A solid-state image pickup apparatus, including:
a photoelectric conversion unit that generates a charge depending on incident light;
a first holding unit that holds the charge transferred from the photoelectric conversion unit;
a first transfer gate unit that controls the transfer of the charge from the photoelectric conversion unit to the first holding unit;
a charge drain unit that is a drain destination of the charge generated by the photoelectric conversion unit;
a first drain gate unit that controls the transfer of the charge from the photoelectric conversion unit to the charge drain unit; and
a second drain gate unit that connects the charge drain unit with a constant voltage source.

(2) The solid-state image pickup apparatus according to (1), further including:
a second holding unit that holds the charge transferred from the photoelectric conversion unit between the photoelectric conversion unit and the first holding unit; and
a second transfer gate unit that controls the transfer of the charge from the photoelectric conversion unit to the second holding unit.

(3) The solid-state image pickup apparatus according to (2), in which
the second transfer gate unit is constituted of one or more gates.

(4) The solid-state image pickup apparatus according to any one of (1) to (3), in which
the second drain gate unit is formed in an area different from a pixel portion.

(5) The solid-state image pickup apparatus according to any one of (1) to (3), in which the second drain gate unit is formed in a wiring layer.

(6) The solid-state image pickup apparatus according to (5), in which
the second drain gate unit is formed in the wiring layer as a transistor of an oxide semiconductor.

(7) The solid-state image pickup apparatus according to any one of (1) to (6), in which
the second drain gate unit has a gate voltage in an exposure time of the photoelectric conversion unit which is set to a value between a negative voltage in a non-conduction state and a power supply voltage in a conduction state.

(8) The solid-state image pickup apparatus according to any one of (1) to (6), in which
the second drain gate unit has a drain voltage in an exposure time of the photoelectric conversion unit which is set to a value between 0 V and a power supply voltage in a conduction state.

(9) The solid-state image pickup apparatus according to any one of (1) to (8),
the solid-state image pickup apparatus being a front-surface irradiation type.

(10) The solid-state image pickup apparatus according to any one of (1) to (8),
the solid-state image pickup apparatus being a back-surface irradiation type.

(11) The solid-state image pickup apparatus according to any one of (1) to (10), the solid-state image pickup apparatus being a lamination type.

(12) An electronic apparatus on which a solid-state image pickup apparatus is mounted, the solid-state image pickup apparatus including
a photoelectric conversion unit that generates a charge depending on incident light,
a first holding unit that holds the charge transferred from the photoelectric conversion unit,
a first transfer gate unit that controls the transfer of the charge from the photoelectric conversion unit to the first holding unit,
a charge drain unit that is a drain destination of the charge generated by the photoelectric conversion unit,
a first drain gate unit that controls the transfer of the charge from the photoelectric conversion unit to the charge drain unit, and a second drain gate unit that connects the charge drain unit with a constant voltage source.

REFERENCE SIGNS LIST

20 CIS
21 PD
22 TG
24 FD
25 RST
26 AMP
27 SEL
28 OFG
29 OFD
30 OFG
31 OFD
60 CIS
61 MEM
62 TX
70 CIS
80 CIS
90 CIS
91 control Tr
100 CIS
101 light shielding film
110 CIS
111 light shielding film

What is claimed is:

1. A solid-state image pickup apparatus, comprising:
a photodiode that generates a charge depending on incident light;
a floating diffusion that holds the charge transferred from the photodiode;
a first transfer gate that controls the transfer of the charge from the photodiode to the floating diffusion;
a charge drain diffusion that is a drain destination of the charge generated by the photodiode;
a first control gate that controls the transfer of the charge from the photodiode to the charge drain diffusion;
a second control gate formed in a wiring layer that connects the charge drain diffusion with a constant voltage source;
a holding diffusion between the photodiode and the floating diffusion that holds the charge transferred from the photodiode; and
a second transfer gate that controls the transfer of the charge from the photodiode to the holding diffusion, wherein the second transfer gate includes two gates.

2. The solid-state image pickup apparatus according to claim 1, wherein the second control gate is formed in an area different from a pixel portion.

3. The solid-state image pickup apparatus according to claim 1, wherein the second control gate is formed in the wiring layer as a transistor of an oxide semiconductor.

4. The solid-state image pickup apparatus according to claim 1, wherein the second control gate has a gate voltage in an exposure time of the photodiode that is set to a value between a negative voltage in a non-conduction state and a power supply voltage in a conduction state.

5. The solid-state image pickup apparatus according to claim 1, wherein the second control gate has a drain voltage in an exposure time of the photodiode that is set to a value between 0 V and a power supply voltage in a conduction state.

6. The solid-state image pickup apparatus according to claim 1, the solid-state image pickup apparatus being a front-surface irradiation type.

7. The solid-state image pickup apparatus according to claim 1, the solid-state image pickup apparatus being a back-surface irradiation type.

8. The solid-state image pickup apparatus according to claim 1, the solid-state image pickup apparatus being a lamination type.

9. An electronic apparatus on which a solid-state image pickup apparatus is mounted, the solid-state image pickup apparatus including:
a photodiode that generates a charge depending on incident light;
a floating diffusion that holds the charge transferred from the photodiode;
a first transfer gate that controls the transfer of the charge from the photodiode to the floating diffusion;
a charge drain diffusion that is a drain destination of the charge generated by the photodiode;
a first control gate that controls the transfer of the charge from the photodiode to the charge drain diffusion;
a second control gate formed in a wiring layer that connects the charge drain diffusion with a constant voltage source;
a holding diffusion between the photodiode and the floating diffusion that holds the charge transferred from the photodiode; and
a second transfer gate that controls the transfer of the charge from the photodiode to the holding diffusion, wherein the second transfer gate includes two gates.

10. The electronic apparatus according to claim 9, wherein the second control gate is formed in an area different from a pixel portion.

11. The electronic apparatus according to claim 9, wherein the second control gate is formed in the wiring layer as a transistor of an oxide semiconductor.

12. The electronic apparatus according to claim 9, wherein the second control gate has a gate voltage in an exposure time of the photodiode that is set to a value between a negative voltage in a non-conduction state and a power supply voltage in a conduction state.

13. The electronic apparatus according to claim 9, wherein the second control gate has a drain voltage in an exposure time of the photodiode that is set to a value between 0 V and a power supply voltage in a conduction state.

14. The electronic apparatus according to claim 9, the solid-state image pickup apparatus being a front-surface irradiation type.

15. The electronic apparatus according to claim 9, the solid-state image pickup apparatus being a back-surface irradiation type.

16. The electronic apparatus according to claim 9, the solid-state image pickup apparatus being a lamination type.

* * * * *